(12) United States Patent
Bonakdar et al.

(10) Patent No.: US 9,767,858 B2
(45) Date of Patent: Sep. 19, 2017

(54) REGISTER FILES INCLUDING DISTRIBUTED CAPACITOR CIRCUIT BLOCKS

(71) Applicant: Intel Corporation, Santa Clara, CA (US)

(72) Inventors: Hamid-Reza S. Bonakdar, Hillsboro, OR (US); Jaydeep Kulkarni, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/413,171

(22) Filed: Jan. 23, 2017

(65) Prior Publication Data

US 2017/0133061 A1    May 11, 2017

Related U.S. Application Data

(62) Division of application No. 14/937,010, filed on Nov. 10, 2015, now Pat. No. 9,552,854.

(51) Int. Cl.
*G11C 7/00* (2006.01)
*G11C 5/02* (2006.01)
*G11C 5/10* (2006.01)

(52) U.S. Cl.
CPC .............. *G11C 5/025* (2013.01); *G11C 7/00* (2013.01); *G11C 5/10* (2013.01)

(58) Field of Classification Search
CPC .............. G11C 7/00; G11C 5/025; G11C 5/10
USPC ............ 365/189.11, 63, 72, 185.11, 189.05, 365/230.03
See application file for complete search history.

(56) References Cited

U.S. PATENT DOCUMENTS

| | | | |
|---|---|---|---|
| 4,051,388 A | 9/1977 | Inukai | |
| 4,788,664 A | 11/1988 | Tobita | |
| 5,805,124 A | 9/1998 | Kapoor et al. | |
| 5,903,498 A * | 5/1999 | Campardo | G11C 16/08 365/185.11 |
| 6,275,438 B1 | 8/2001 | Jeong | |
| 6,411,556 B1 * | 6/2002 | Amano | G11C 29/785 365/200 |
| 9,552,854 B1 | 1/2017 | Bonakdar et al. | |
| 2003/0223262 A1 * | 12/2003 | Fujisawa | G11C 5/025 365/63 |
| 2007/0008780 A1 | 1/2007 | Jung et al. | |

OTHER PUBLICATIONS

"U.S. Appl. No. 14/937,010, Notice of Allowance mailed Sep. 15, 2016", 9 pgs.
"U.S. Appl. No. 14/937,010, Restriction Requirement mailed Jul. 8, 2016", 6 pgs.

* cited by examiner

*Primary Examiner* — Tan T. Nguyen
(74) *Attorney, Agent, or Firm* — Schwegman Lundberg & Woessner, P.A.

(57) ABSTRACT

Some embodiments include apparatuses having a first node to receive a supply voltage, a second node, a switching circuit to couple the first node to the second node and to decouple the first node from the second node, circuit blocks coupled to the second node and the switching circuit, and drivers coupled to the second node. Each of the circuit blocks includes a capacitor having a plate coupled to the second node. Each of the drivers is associated with a conductive line. The conductive line is associated with memory cells.

20 Claims, 10 Drawing Sheets

100

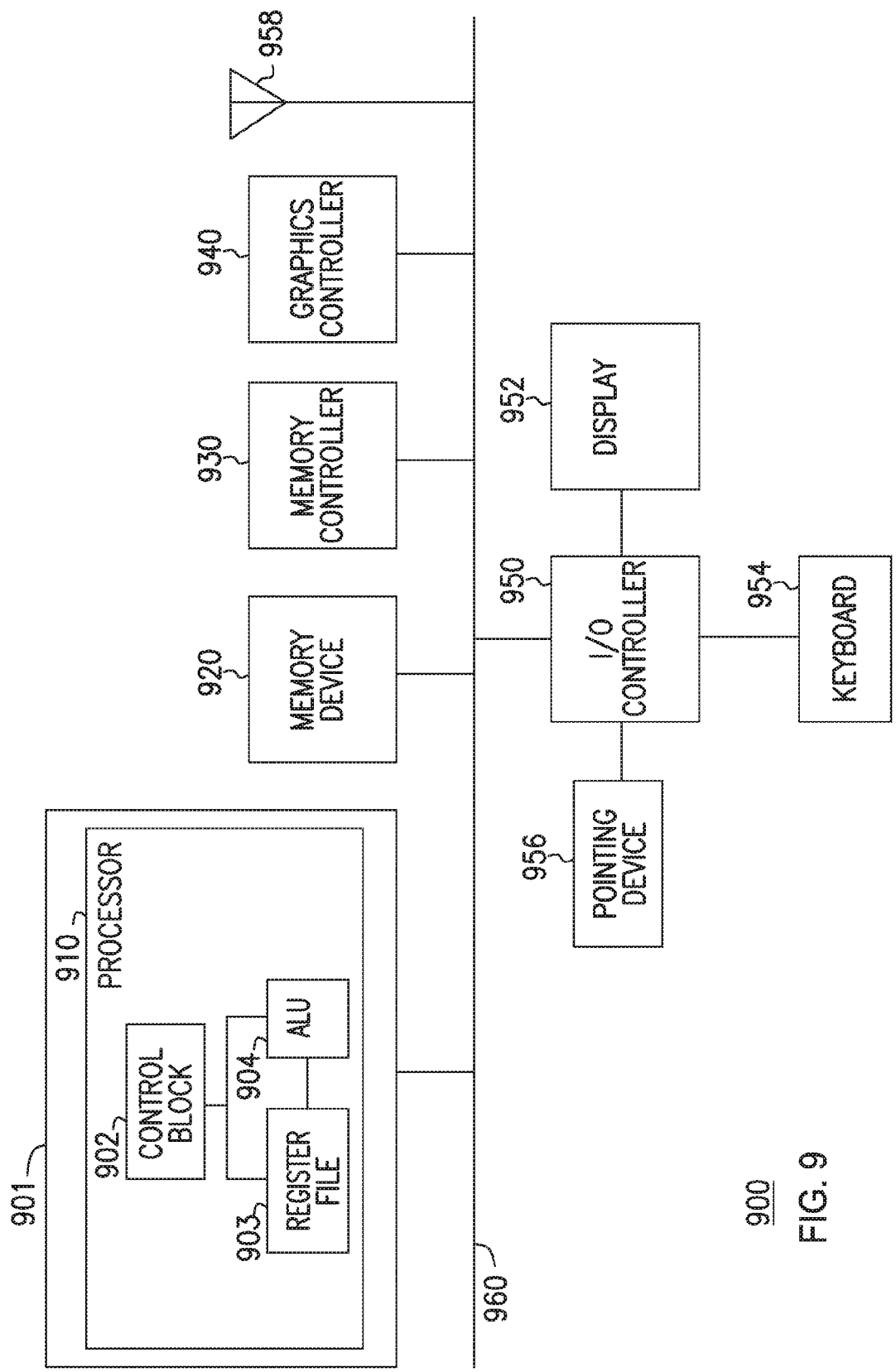

REGISTER FILES INCLUDING DISTRIBUTED CAPACITOR CIRCUIT BLOCKS

RELATED APPLICATION

This application is a divisional of U.S. patent application Ser. No. 14/937,010, filed Nov. 10, 2015, which is incorporated herein by reference in its entirety.

TECHNICAL FIELD

Embodiments described herein pertain to memory devices. Some embodiments relate to memory register files.

BACKGROUND

Many electronic systems, such as computers and mobile devices, include a memory device to store information. The memory device usually has numerous memory cells. The memory device performs a write operation to store information in the memory cells and a read operation to retrieve information from the memory cells. A conventional memory device often has circuitry to provide a specific voltage to some parts of the device at a certain time during a read or write operation to ensure proper device operation. As described in more detail below, such circuitry in some conventional memory devices have limitations that may be inapplicable for some device configurations.

BRIEF DESCRIPTION OF THE DRAWINGS

FIG. 9 shows an apparatus in the form of an electronic system, according to some embodiments described herein.

DETAILED DESCRIPTION

Figure 1:
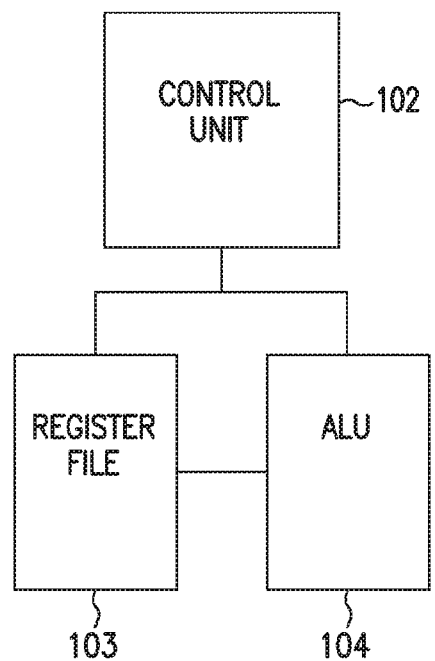
FIG. 1 shows a block diagram of an apparatus in the form of a processor, according to some embodiments described herein.

The techniques described herein introduce ways to boost a voltage on conductive lines (e.g., word lines) during part of an operation (e.g., read or write operation) in a register file. The described techniques will allow reduced operating voltage (e.g., Vmin) for such an operation.

During part of a read or write operation, the techniques described herein boost the value of voltage on conductive lines (e.g., word lines) to a value above supply voltage (e.g., Vcc) and speed up the operation (read or write operation). The techniques described herein are also compiler friendly and area efficient and can be applied to different memory sizes and configurations. The described techniques may help in reducing the design effort by reducing the number of circuitry needed to be analyzed, built, and verified for different memory sizes at different stages of compiler development.

Some conventional voltage boosting techniques in register files may use logic circuitry (e.g., logic OR) that combines far-end word lines to signal the right boost time. This may not be feasible for a large number of entries in a register file. Some other conventional techniques may use delay circuitry to achieve similar same function. This may be undesirable solutions for compilers because different word line arrangements (e.g., word line fan-out) have different word line delay. Thus, additional tuning circuitry may be needed for such delay circuitry.

Conventional voltage boosting techniques may also lack an effective implementation that fits requirement of different memory sizes and configurations in order to prevent excessive boost and device area penalty.

The techniques described herein provide an "area-efficient" and "compiler friendly" way to detect an appropriate timing to trigger the voltage boost during an operation in the register file, and a way to adjust the capacitance associated with the voltage boost for different memory sizes. Further, the techniques described herein can be applied to different memory configurations, such as segmented-write, bit-write, and other configurations. Other advantages of the described techniques include a reduction in memory area for the same minimum operating voltage Vmin and a reduction in leakage current.

As described in more detail below, the techniques described herein add a dummy word-line row and its associated loading to model the actual word-line for a corresponding group of word-lines (in which the group word-lines share power and an isolation device). The dummy word line row is used to signal (trigger) the start of the voltage boost operation.

A number of circuit blocks (which are part of the voltage boost circuitry) are also strategically placed to minimize area penalty due to the boost circuitry. These circuit blocks include a combination of dummy word-line drivers (and their respective loading) and components of the boost circuitry (e.g., the flying capacitor circuits and their respective drivers and isolation devices).

The number of circuit blocks containing the word-line load and flying capacitor circuits can be adjustable (e.g., increased or decreased) based on the size of the register file (e.g., the number of entries, the number of bits in each of the entries, or the combination of both). Thus, based on the techniques described herein, the resulting voltage boost can scale accordingly. This may prevent excessive boost while providing the right boost to achieve the intended reduction in the value of the minimum operating voltage (e.g., Vmin).

FIG. 1 shows a block diagram of an apparatus in the form of a processor 100, according to some embodiments described herein. Processor 100 can include a general-purpose processor or an application-specific integrated circuit (ASIC). Processor 100 can be part of (e.g., included in) an electronic device or system, such as a computer (e.g., desktop or notebook computer), a tablet, a cellular telephone, and other electronic devices or systems.

As shown in FIG. 1, processor 100 can include a control unit 102, a register file 103 and an arithmetic logic unit (ALU) 104. One skilled in the art would recognize that a processor (e.g., a central processing unit (CPU)) such as processor 100 includes many additional components, several of which are not shown in FIG. 1 so as not to obscure the embodiments described herein. Control unit 102 can be arranged (e.g., configured) to control operations of processor 100. For example, control unit 102 may include logic circuitry (e.g., control logic and instruction decoders) and other components to control operations of processor 100. Register file 103 can include memory cells that can be arranged (e.g., configured) to store information (e.g., data, instruction codes, and other information). Processor 100 can be included in an IC die (e.g., an IC chip), such that control unit 102, register file 103, and ALU 104 can be located on (e.g., formed on or formed in) the same IC die (e.g., same IC chip).

Register file 103 can include structures and perform operations of the register files described below with reference to FIG. 2 through FIG. 9.

Figure 2:
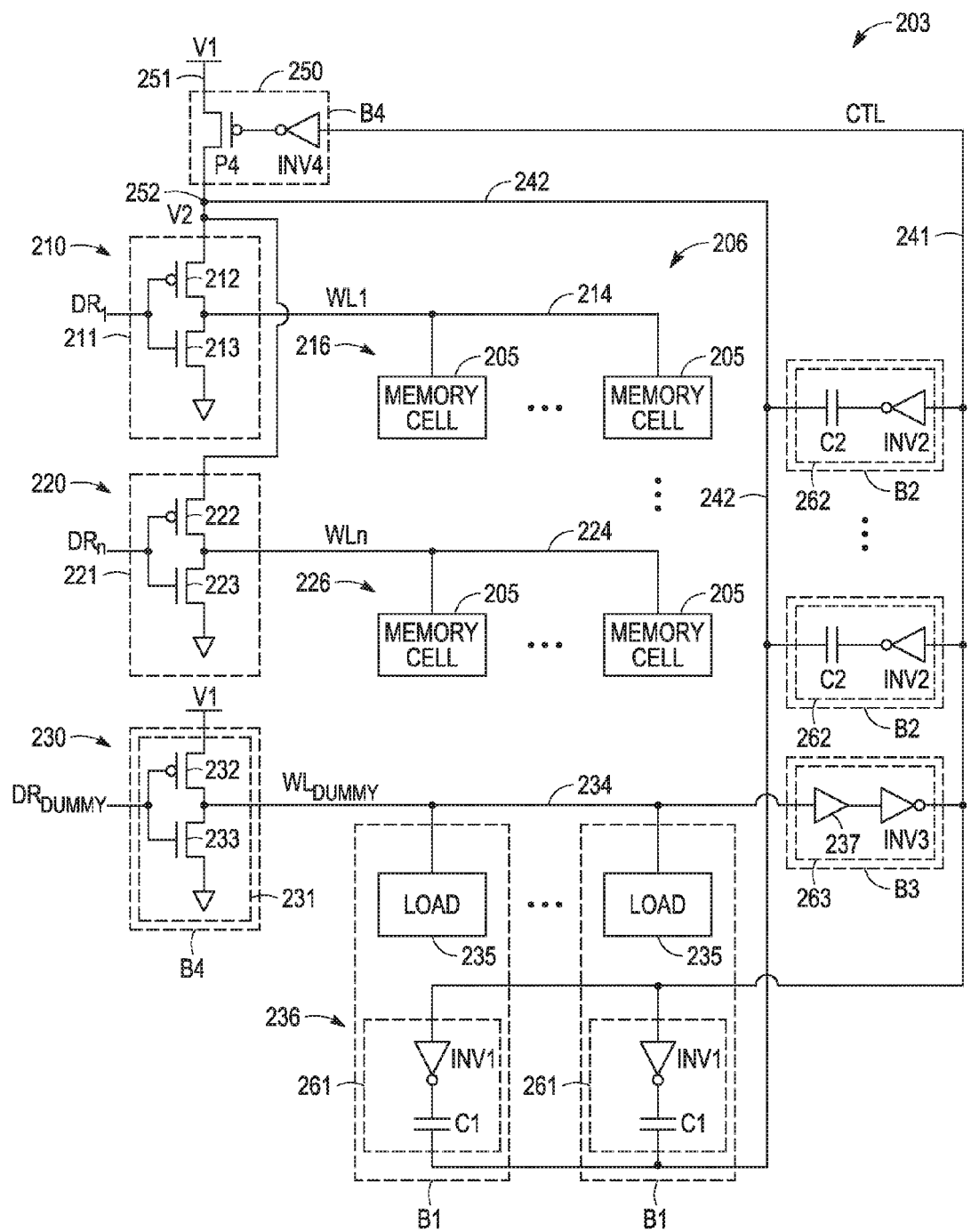
FIG. 2 shows a schematic diagram of a part of a register file including distributed circuit blocks, according to some embodiments described herein.

FIG. 2 shows a schematic diagram of a part of register file 203 including distributed circuit blocks B1, B2, B3, and B4, according to some embodiments described herein. Register file 203 can include register file 103 of FIG. 1. As shown in FIG. 2, register file 203 can include memory cells 205 that can be arranged in rows and can be part of a memory array 206. Register file 203 can include portions 210 and 220. Each of portions 210 and 220 can include entries of register file 203.

Portion 210 can include a driver 211 having transistors 212 and 213, and a conductive line 214 associated with a memory cell group 216, which includes memory cells 205 of portion 210. Conductive line 214 can conduct a signal (e.g., word line signal) WL1 to access memory cells 205 in memory cell group 216 during read and write operations of register file 203.

Portion 220 can include a driver 221 having transistors 222 and 223, and a conductive line 224 associated with a memory cell group 226, which includes memory cells 205 of portion 220. Conductive line 224 can conduct a signal (e.g., word line signal) WLn to access memory cells 205 in memory cell group 226 during read and write operations of register file 203.

Drivers 211 and 221 can be part of a decoder (not shown in FIG. 2) of register file 203. Signals DR1 and DRn can be provided from the decoder to control (e.g., turn on or turn off) drivers 211 and 221, respectively.

FIG. 2 shows only two portions (e.g., two entries) 221 and 220 of register file 203 as an example, the number of portions (e.g., entries) in register file 203 can vary.

Register file 203 can also include a portion 230, which is a model of portions 210 and 220 to form a self-tracking dummy portion and is part of circuitry that performs a voltage boost operation in register file 203. Portion 230 can be viewed as a dummy entry in register file 203. Portion 230 can include a driver 231 having transistors 232 and 233, and a conductive line 234 associated with a load group 236, which includes loads 235. Although conductive line 234 may be similar to conductive line 214 or 224, conductive line 234 is not be used as a word line of register file 203 to access memory cells 205. Thus, conductive line 234 can be referred to as a dummy word line.

Driver 231 can respond to a signal $DR_{DUMMY}$. Conductive line 234 can conduct a signal (e.g., dummy word line signal) $WL_{DUMMY}$ and generate a control signal CTL on a circuit path 241 (e.g., a conductive routing) during part of the voltage boost operation. Signal CTL is used to control the switching of a switching circuit 250. For example, one level of signal CTL may cause switching circuit 250 to couple a node 251 to a node 252. Another level of signal CTL may cause switching circuit 250 to decouple node 251 from node 252.

Portion 230 is a model of portions 210 and 220, such that the number (e.g., L) of loads 235 in load group 236 can be equal to the number (e.g., M) of memory cells 205 in each of memory cell group 216 and 226 (e.g., L=M). Thus, in a voltage boost operation in register file 203, as the number of memory cells 205 in each of memory cell group 216 and 226 increases, the load (e.g., word line capacitive load) associated with each of conductive lines 214 and 224 also increases. Therefore, conductive line 234 could see the net increase in capacitance and resulting RC delay and correctly signals an appropriate time to activate a signal (e.g., CTL) to start the voltage boost operation.

Unlike memory cells 205, which are arranged to store information, loads 235 are not arranged to store information. However, load parameters of each of loads 235 can be modeled to be the same (or substantially the same) as parameters of each of memory cells 205. For example, each of loads 235 may include a capacitive load (e.g., gate load) corresponding to (e.g., the same as) the capacitance (e.g., gate load) of each of memory cells 205.

The arrangement of portion 230 as a model of portion 210 or 220 may improve the boost operation in comparison with some conventional techniques (e.g., logic circuitry and delay circuitry techniques). Further, because the arrangement of portion 230 is self-tracking, it may not need to be redesigned for different specific word line fan-outs. This also may be beneficial in a compiler world where a solution that fits many different memory sizes (e.g., array sizes) with minimum effort is essential.

As shown in FIG. 2, register file 203 can also include capacitors (e.g., flying capacitors) C1 and C2, inverters INV1, INV2, INV3, and INV4, a buffer 237, and a transistor (e.g. a float device) P4. These components, in addition to driver 231 and loads 235, are parts of circuitry that performs a voltage boost operation in register file 203.

Node 251 can include a supply node (or can be part of a supply rail) of register file 203. Node 251 can receive a supply voltage V1 (e.g., Vcc). Each of capacitors C1 and C2 can include a plate coupled to node 252 through a circuit path 242 (e.g., conductive routing). Each of capacitors C1 and C2 can include a transistor-based capacitor, such that the source and drain of the transistor are directly connected to each other. Transistor P4 and inverter INV4 may form switching circuit 250 that is controlled (turned on or turned off) by signal CTL. The connections of switching circuit 250 between nodes 251 and 252 and the connections of capacitors C1 and C2 to node 252 allow the value of a voltage V2 at node 252 to be greater than the value of voltage V1 at node 251 (e.g., V2>V1) during part of the voltage boost operation of register file 203.

As shown in FIG. 2, capacitors C1 and inverter INV1 can form capacitive units 261. The number of capacitive units 261 can be equal to the number of memory cells 205 in each of memory cell groups 216 and 226. One of capacitive units 261 and one of loads 235 can be combined and structured as a circuit block B1.

Capacitors C2 and inverter INV2 can form capacitive units 262. Capacitive units 262 can be structured as a circuit block B2. Inverter INV3 and buffer 237 can form a unit 263. Buffer 237 may reduce loading on inverter INV3. Unit 263 can be structured as a circuit block B3. Switching circuit 250 and driver 231 can be combined and structured as a circuit block B4.

The number of circuit blocks B1 can be equal to the number of memory cells 205 in each of memory cell groups 216 and 226. The number of circuit block B2 can be selected such that the capacitance of circuit block B2 can be a model of the capacitance of a group of entries in register file 203. For example, there may be one circuit block B2 for a corresponding S entries (where S is an integer greater than one). Thus, the number of circuit blocks B2 can be less than the number of entries (e.g., portions 210 and 220) in a specific part (e.g., a sub-portion) of memory array 206.

One skilled in the art would recognize that a register file such as register file 203 includes many additional components (e.g., bit lines and other components), several of which are not shown in FIG. 2 so as not to obscure the embodiments described herein.

Including capacitors C1 and C2 in some of circuit blocks B1, B2, B3, and B4 and distributing circuit blocks B1, B2, B3, and B4 to different locations in an IC die that includes register file 203 may improve placement of components of the register file 203. Such a placement may also improve (e.g., reduce) the value of minimum operating voltage Vmin in register file 203.

For example, in the voltage boost operation, voltage V2 at node 252 is shared by drivers 211 and 221, such that voltage V2 can operate as a shared supply voltage of drivers 211 and 221. Thus, in the voltage boost operation, since V2>V1 during part of the voltage boost operation, the value of the voltage on conductive line 214 (e.g., the level of signal WL1) can also be greater than the value of voltage V1 when driver 211 is turned on (by signal DR1) and couples conductive line 214 to node 252. Similarly, in the voltage boost operation, since V2>V1 during part of the voltage boost operation, the value of the voltage on conductive line 224 (e.g., the level of signal WLn) can also be greater than the value of voltage V1 when driver 221 is turned on (by signal DRn) and couples conductive line 224 to node 252.

The arrangements of circuit blocks B1, B2, B3, and B4 and node 252 may reduce the time that a read or a write operation happens for memory cells for which the word line associated with the memory cells is triggered. This reduction in the time (e.g., delay time) may allow the value of the minimum operating voltage Vmin in register file 203 to be relatively lower than when there is no voltage boost is applied to the word line.

Figure 3A:
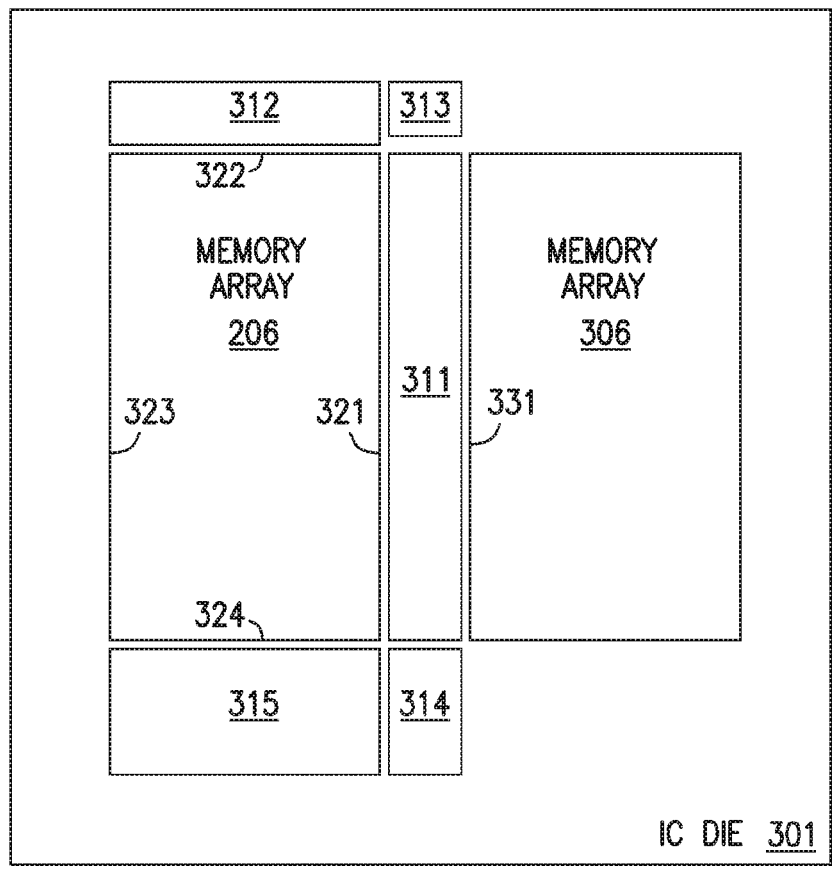
FIG. 3A shows a top view of an integrated circuit (IC) die that includes the components of the register file of FIG. 2, according to some embodiments described herein.

FIG. 3A shows a top view of an IC die 301 that includes the components of register file 203 of FIG. 2, such as memory array 206, according to some embodiments described herein. In FIG. 3A, the top view of IC die 301 can correspond to a layout of IC die 301.

As shown in FIG. 3A, IC die 301 can include memory array 306 in addition to memory array 206. IC die 301 can also include areas (e.g., locations on IC die 301) 311, 312, 313, 314, and 315 for other components of register file 203.

FIG. 3A shows IC die 301 including two memory arrays as an example. The number of memory arrays of IC die 301 can vary.

As shown in FIG. 3A, memory array 206 includes edge 321, 322, 323, and 324. Edges 321 and 323 are opposite from each other. Edges 322 and 324 are opposite from each other. Areas 311, 312, 313, 314, and 315 are located at locations relative to memory arrays 206 and 306. For example, area 311 is adjacent edge 321 (and has a length along edge 321) and between edge 321 of memory array 206 and an edge 331 of memory array 306. Area 312 is adjacent (and has a length along) edge 322 of memory array 206. Area 313 is adjacent areas 311 and 312. Area 314 is adjacent areas 311 and 315. Area 315 is adjacent (and has a length along) edge 324 of memory array 206.

Figure 3B:
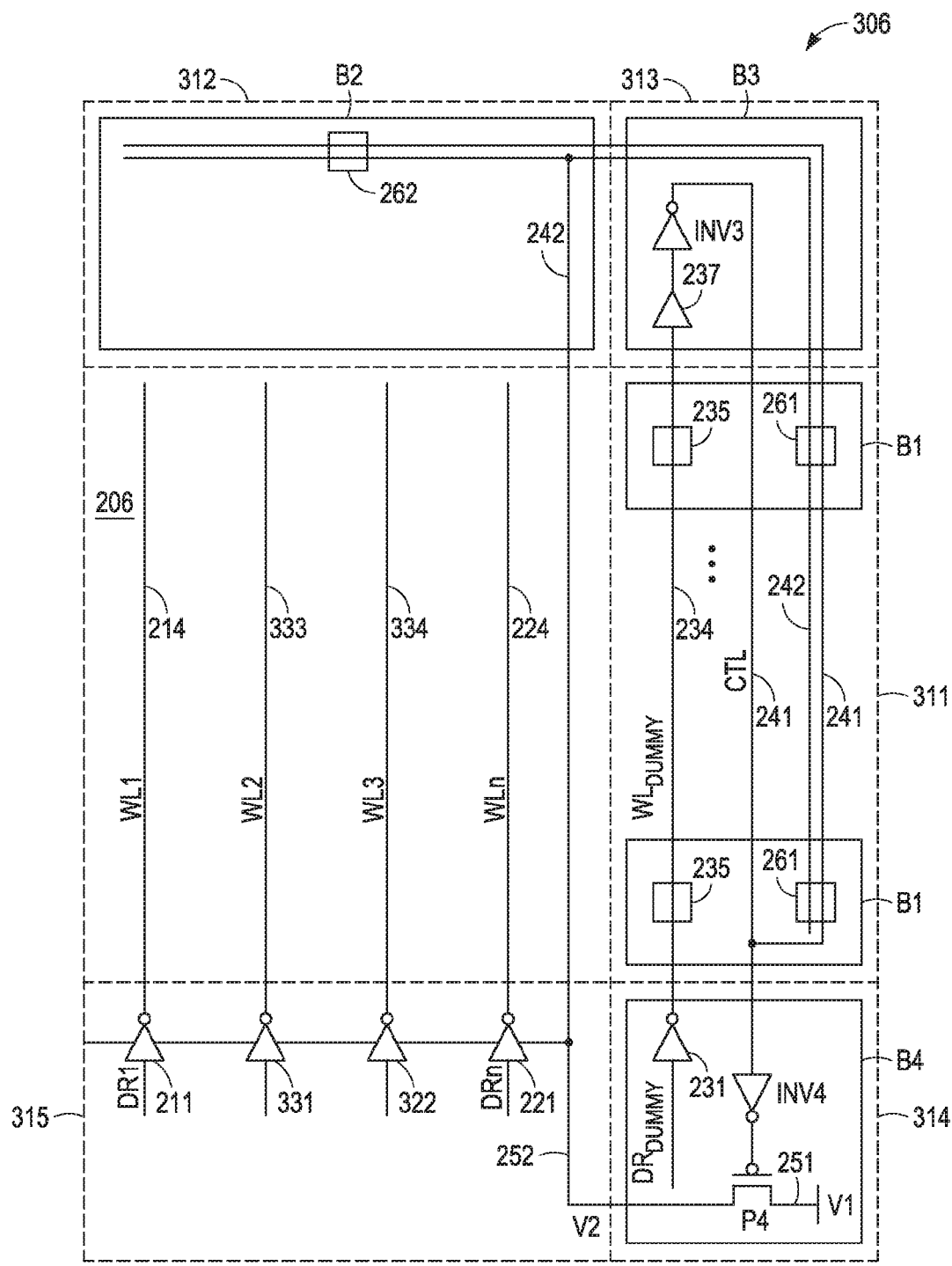
FIG. 3B shows components of the register file of FIG. 2 in different areas of the IC die of FIG. 3A, according to some embodiments described herein.

FIG. 3B shows components of register file 203 in areas 311, 312, 313, 314, and 315, according to some embodiments described herein. As shown in FIG. 3B, circuit block B1 (which includes load 235 and capacitive unit 261) can be located in area 311. Circuit block B2 (which includes capacitive unit 262) can be located in area 312. Circuit block B3 (which includes inverter INV3 and buffer 237) can be located in area 313. Circuit block B4 (which includes driver 231, inverter INV4, and transistor P4) can be located in area 314.

Drivers 211 and 221 can be located in area 315. Area 315 can be part of a decoder (e.g., word line decoder) of register file 203. Conductive lines 214 and 224 can be located over part of memory array 206 and extend in a direction parallel to edge 321 of memory array 206. Circuit paths 241 and 242 can be routed as shown in FIG. 3B. FIG. 3B also shows some of other drivers (e.g., 331 and 332) and their associated conductive lines (e.g., 333 and 334) of register file 203.

FIG. 3B shows an example of placement and relationship between memory arrays 206 and 306 and other components of register file 203 for a read port of register file 203. Examples of other configurations of a register file similar to register file 203 are described below with reference to FIG. 4 through FIG. 9.

One skilled in the art would recognize that a register file such as register file 203 included in IC die 301 has many additional components (e.g., bit lines and other components) included in IC die 301; however, such components are not shown in FIG. 3 so as not to obscure the embodiments described herein.

Figure 4:
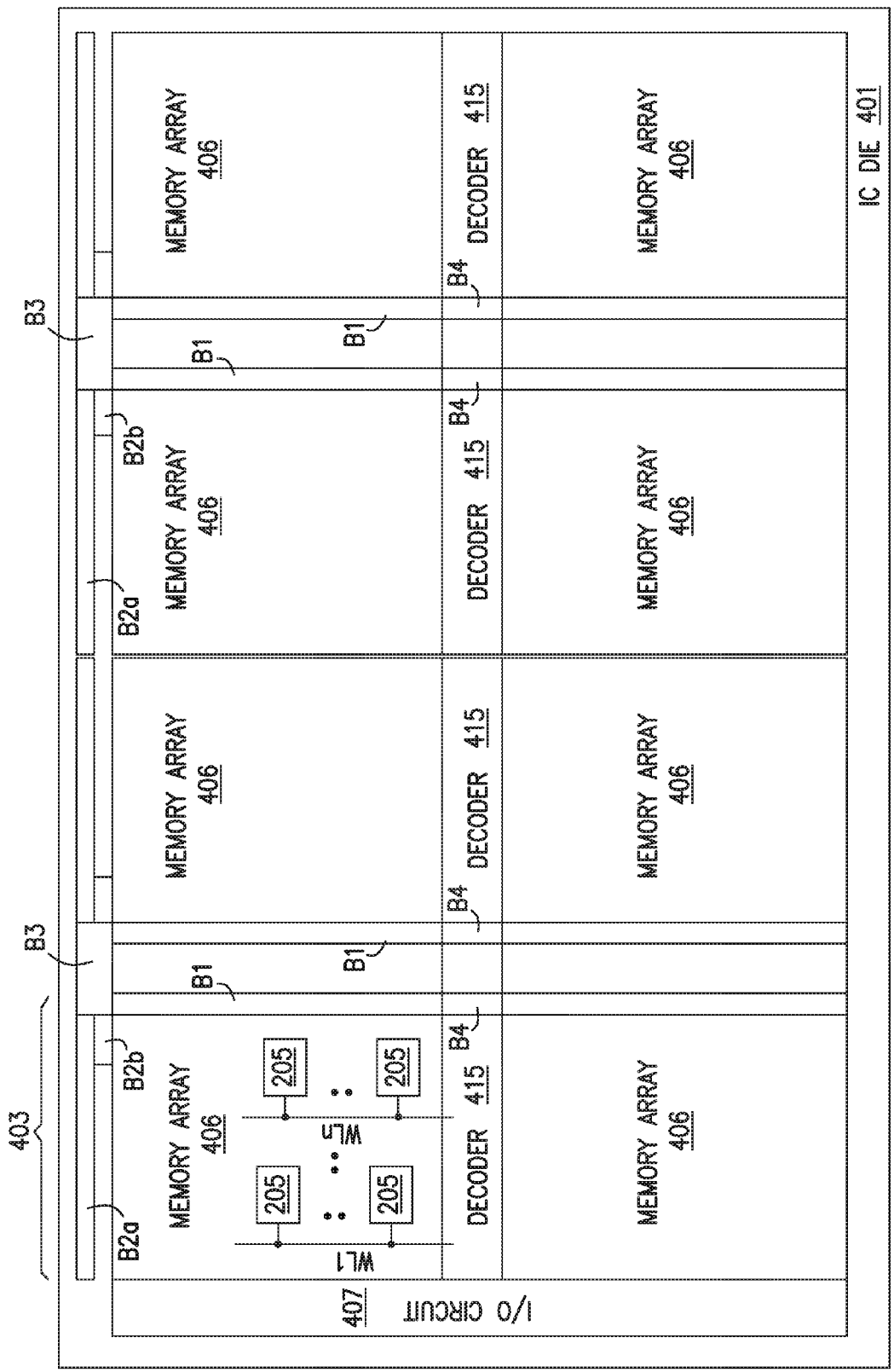
FIG. 4 shows a top view of an IC die having memory arrays and associated circuitry, according to some embodiments described herein.

FIG. 4 shows a top view of an IC die 401 having memory arrays 406 and associated circuitry, according to some embodiments described herein. IC die 401 can be IC die 301 of FIG. 3A and FIG. 3B, such that each of memory arrays 406 can be memory array 206 and 306 described above with reference to FIG. 1 through FIG. 3B.

As shown in FIG. 4, IC die 401 can include conductive lines (e.g., word lines) and associated signals (e.g., WL1 and WLn) and memory cells (e.g., 205) that can be associated with entries of the register files that include memory arrays 406. For simplicity, FIG. 4 shows conductive lines and their associated signals and memory cells in only one of memory arrays 406.

As shown in FIG. 4, IC die 401 can include areas similar to IC die 301 (FIG. 3A) where components of register files of IC die 401 are located. For example, IC die 401 can include areas where circuit blocks B1, B2a, B2b, B3, and B4 of register files of IC die 401 are located. Circuit blocks B1, B3, and B4 are described above with reference to FIG. 2 through FIG. 3B. In FIG. 4, each of circuit blocks B2a and B2b can be the same as circuit block B2 (FIG. 2 through FIG. 3B). However, in FIG. 4, circuit block B2a and B2b can be associated with a read port and a write port, respectively, of the same register file that may include one or more memory arrays 406.

In FIG. 4, the number of circuit blocks B2*b* associated with a write port of a particular register file (e.g., register file 403) can be less than the number of circuit blocks B2*a* associated with that particular the register file (e.g., register file 403).

IC die 401 can also include an input/output (I/O) circuit 407 and decoders 415 located at locations relative to memory arrays 406. FIG. 4 shows eight memory arrays 406 as an example. However, based on the techniques described herein (e.g., the placement of circuit blocks B1, B2*a*, B2*b*, B3, and B4 relative to the locations of memory arrays 406), any number of memory arrays, the size of each memory array, or both, can be realized.

The techniques described above with reference to FIG. 1 through FIG. 4 involve circuitry that performs a voltage boost operation in a register file (e.g., 103, 203, and 403) including circuit blocks (e.g., B1, B2, B3, and B4). Some of the circuit blocks can be models of portions (e.g., entries) of the register file. The circuit blocks can be distributed in different locations relative to the location of one or more memory arrays included in the register file. The number of circuit blocks can be scaled based on the size of the register file. As mentioned above, the described techniques have many improvements over some conventional techniques and can be used to implement register files of different sizes, different configurations, or both.

Figure 5A:
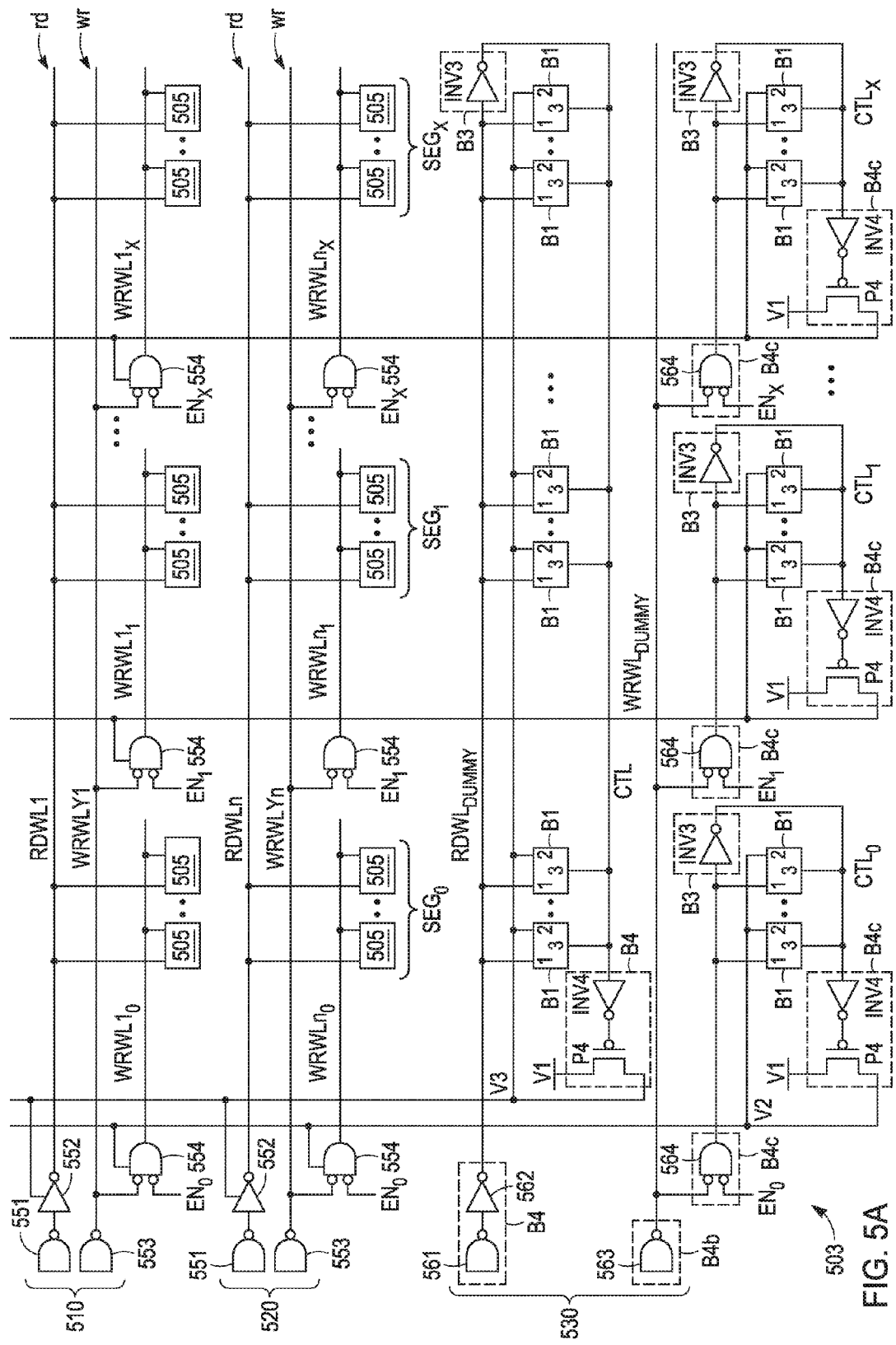
FIG. 5A shows a schematic diagram of a part of a register file including different segments, according to some embodiments described herein.

FIG. 5A shows a schematic diagram of a part of register file 503 including segments $SEG_0$, $SEG_1$, and $SEG_X$, according to some embodiments described herein. FIG. 5A shows segments $SEG_0$, $SEG_1$, and $SEG_X$ having memory cells 505 associated with two portions (e.g., entries) 510 and 520, as an example. However, the number of portions of segments $SEG_0$, $SEG_1$, and $SEG_X$ can vary.

As shown in FIG. 5A, each of entries 510 and 520 is associated with one read port rd (which can include signal RDWL1 or RDWLn) and one write port wr (which can include signal WRWLY1 or WRWLYn). The number of read and write ports can vary. For example, a register file having multi-port read ports and multi-write ports (e.g., two read ports and two write ports or 2r2w) can be realized based on the arrangement similar to register file 503 of FIG. 5A, During a read operation, all segments $SEG_0$, $SEG_1$, and $SEG_X$ can be selected to read information from memory cells 505 based on signals RDWL1 and RDWLn. During a write (e.g., segmented write) operation, only one of the segments $SEG_0$, $SEG_1$, and $SEG_X$ can be selected at a time to store information in memory cells 505 of the selected segment based on signals $EN_0$, $EN_1$, and $EN_X$, WRWLY1 and WRWLYn.

Each of portions 510 and 520 can include a logic gate (e.g., NAND) 551 and a driver 552 that can be part of a decoder (e.g., read decoder) associated with read port rd. Each of portions 510 and 520 can include a logic gate (e.g., NAND) 553 that can be part of a decoder (e.g., write decoder) associated with write port wr. Each of portions 510 and 520 can also include a logic gate 554 (e.g., NOR) that can be part of a local decoder (e.g., a mini-decoder) associated with write port wr. Logic gates 554 can receive signals (e.g., enable signals) $EN_0$, $EN_1$, and $EN_X$ and can operate as drivers for signals $WRWL1_0$, $WRWL1_1$, and $WRWL1_X$, $WRWLn_0$, $WRWLn_1$, and $WRWLn_X$.

Figure 5B:
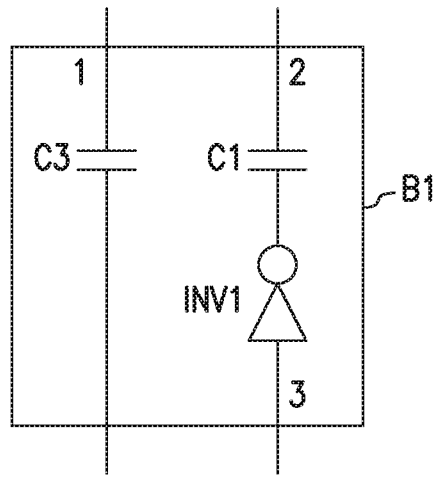
FIG. 5B shows a schematic diagram for a circuit block of the register file of FIG. 5A, according to some embodiments described herein.

Portion 530 of register file 503 is a model of read and write ports of each of portions 510 and 520. Portion 530 is part of a circuitry that performs a voltage boost operation of register file 503. Portion 530 can be viewed as a dummy entry in register file 503. Portion 530 can receive voltage V1 and can include transistor P4, and inverters INV3 and INV4 that can be similar to or the same as transistor P4, and inverters INV3 and INV4, respectively, of FIG. 2. Voltage V2 in FIG. 5A can be similar to voltage V2 of FIG. 2. Voltage V3 in FIG. 5A can be shared by drivers 552. Similar to voltage V2, the value of a voltage V3 can be greater than the value of voltage V1 (e.g., V3>V1) during part of the voltage boost operation of register file 503. In FIG. 5A, each of signals CTL, $CTL_0$, $CTL_1$, and $CTL_X$ can be controlled (e.g., activated) during a voltage boost operation similar to signal CTL of FIG. 2. Portion 530 can include circuit blocks B1 having terminals 1, 2, and 3. A schematic diagram of circuit block B1 is shown in FIG. 5B. Capacitor C3 in circuit block B1*b* in FIG. 5B can be a model of one of memory cell 505 (FIG. 5A).

As shown in FIG. 5A, portion 530 can include a logic gate (e.g., NAND) 561 and a driver 562 that can be structured as circuit block B4. Driver 562 can be associated with a conductive line that can conduct a signal $RDWL_{DUMMY}$ to generate a signal CTL. Portion 530 can include a logic gate (e.g., NAND) 563 that can operate as a driver and can be structured as a circuit block B4*b*. Logic gate 563 can be associated with a conductive line that can conduct a signal $WRWLY_{DUMMY}$. Portion 530 can include logic gates (e.g., NOR) 564 associated with signal $EN_0$, $EN_1$, and $EN_X$. Each of logic gates 564 can operate as a driver to provide one of signals $CTL_0$, $CTL_1$, and $CTL_X$. Logic gates 564 one can be combined into one circuit block B4*c*.

Register file 503 also include components (not shown in FIG. 5A) that can be associated with circuit blocks, such as circuit blocks B2*a* and B2*b* of FIG. 4. As described above with reference to FIG. 2 through FIG. 4, circuit block B2*a* is associated with a read port and includes the same components as circuit block B2 of FIG. 2. Circuit block B2*b* is associated with a write port and includes the same components as circuit block B2 of FIG. 2.

One skilled in the art would recognize that a register file such as register file 503 includes many additional components (e.g., bit lines and other components), several of which are not shown in FIG. 5A so as not to obscure the embodiments described herein.

Including portion 530 as a model of portions 510 and 520 and using it as part of a circuitry that performs a voltage boost operation of register file 503 may provide improvements, such as those described above with reference to FIG. 2 through FIG. 4.

Figure 6:
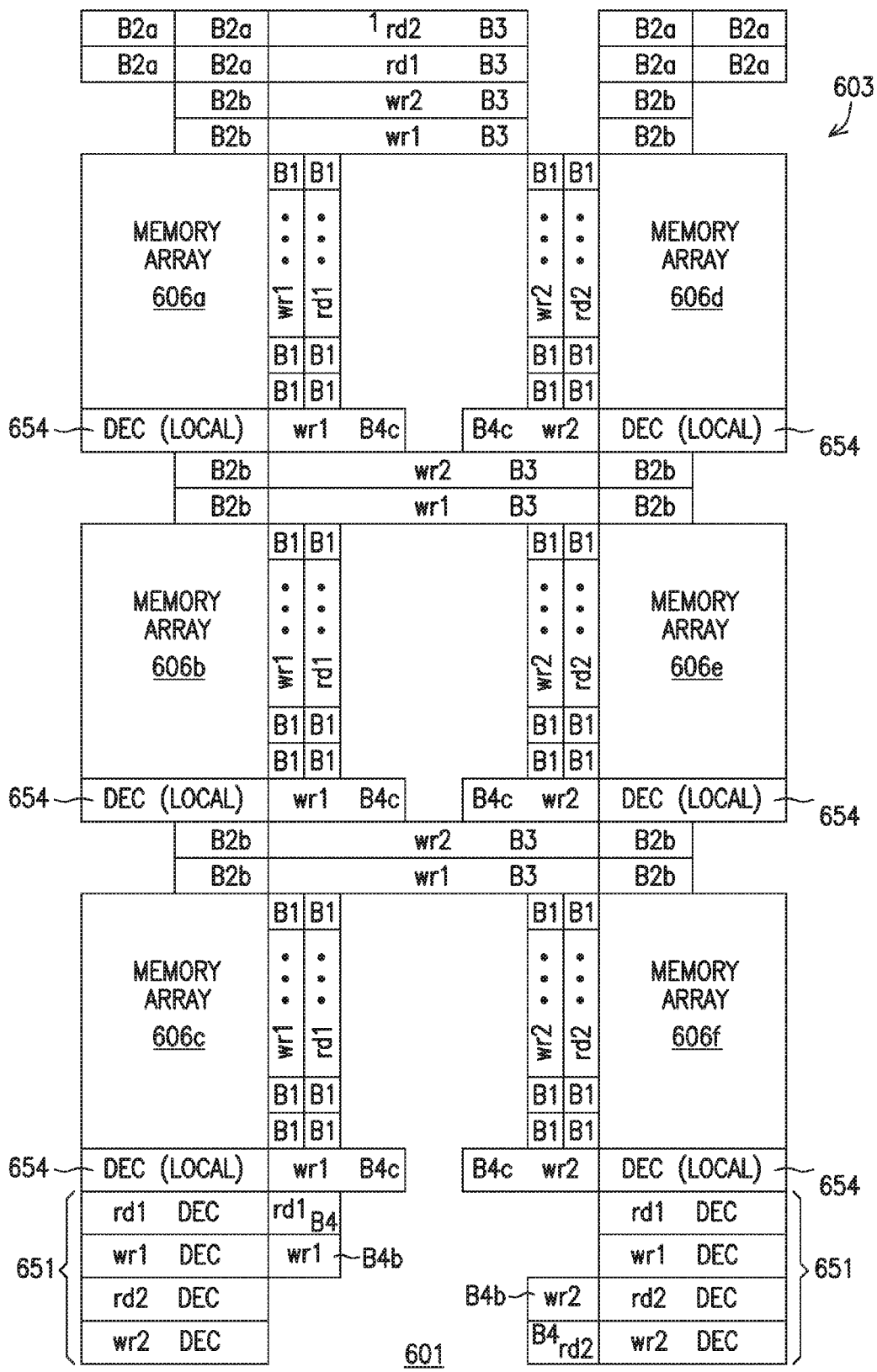
FIG. 6 shows a top view of an IC die including a register file having 2 read ports, 2 write ports with segmented write, according to some embodiments described herein.

FIG. 6 shows a top view of an IC die 601 including a register file 603 having multiple read ports and multiple write ports, according to some embodiments described herein. The top view of IC die 601 can correspond to a layout of IC die 601. Register file 603 can include register file 503 of FIG. 5A. As shown in FIG. 6, register file 603 can include circuit blocks B1, B2*a*, B2*b*, B3, B4*a*, and B4*b* located at different locations relative to memory arrays 606*a*, 606*b*, 606*c*, 606*d*, 606*e*, and 606*f*. Each of these memory arrays includes memory cells (not shown in FIG. 6), such as memory cells 205 of FIG. 2 or memory cells 505 of FIG. 5A.

FIG. 6 shows an example of register file 603 including two read ports and two write ports (2r2w). Components associated with the two read ports are labeled "rd1" (one of the two read ports) and "rd2" (the other one of the two read ports). Components associated with the two write ports are labeled "wr1" (one of the two write ports) and "wr2" (the other one of the two write ports).

Register file 603 can include a decoder (DEC) 651 associated with the read ports (rd1 and rd2) and write ports (wr1 and wr2). During a read operation and a write operation (e.g., segmented write) of register file 603, decoder 651 can operate to provide signals (e.g., RDWL1, RDWLn, WRWLY1, WRWLYn in FIG. 5A) to selectively access memory cells in memory arrays 606a, 606b, 606c, 606d, 606e, and 606f. Decoder 651 can include components (e.g., components associated with global circuitry for read and write ports) such as logic gates 551 and 553 and drivers 552 of FIG. 5A.

Register file 603 can include a decoder (e.g., a local decoder DEC) 654 associated with the write ports (wr1 and wr2). During a write operation of register file 603, decoder 654 can operate to provide signals (e.g., $WRWL1_0$, $WRWL1_1$, and $WRWL1_X$, $WRWLn_0$, $WRWLn_1$, and $WRWLn_X$ in FIG. 5A) to selectively access memory cells (e.g., in a particular segment) in memory arrays 606a, 606b, 606c, 606d, 606e, and 606f. Decoder 654 can include components (e.g. components associated with local circuitry for write ports), such as logic gates 554 of FIG. 5A.

As shown in FIG. 6, register file 603 can include circuit blocks B1, B2a, B2b, B3, B4a, and B4b that can be part of a circuitry that performs a voltage boost operation of register file 603. Circuit blocks B1, B2a, B2b, B3, B4a, and B4b can include components similar to or the same as the circuit blocks described above with reference to FIG. 1 through FIG. 5B.

For example, in FIG. 6, circuit blocks B1 can include circuit blocks B1 of FIG. 5A and FIG. 5B. Each of circuit blocks B2a and B2b in FIG. 6 can include circuit blocks B2 of FIG. 2 (which can be similar to blocks B2a and B2b of FIG. 4). Circuit blocks B3, B4b, and B4c can include circuit blocks B3, B4b, respectively, of FIG. 5A.

One skilled in the art would recognize that a register file such as register file 603 includes many additional components (e.g., bit lines and other components), several of which are not shown in FIG. 6 so as not to obscure the embodiments described herein.

The arrangement of register file 603 (e.g., the arrangement of circuit blocks B1, B2a, B2b, B3, B4a, and B4b) may provide improvements, such as those described above with reference to FIG. 2 through FIG. 5B.

Figure 7B:
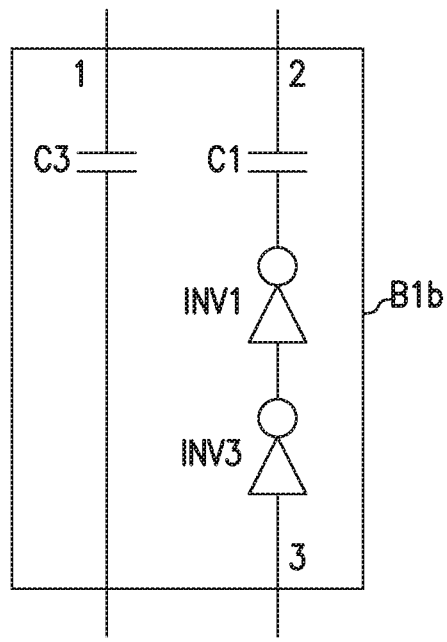
FIG. 7B shows a schematic diagram of a circuit block of the register file of FIG. 7A, according to some embodiments described herein.
Figure 7A:
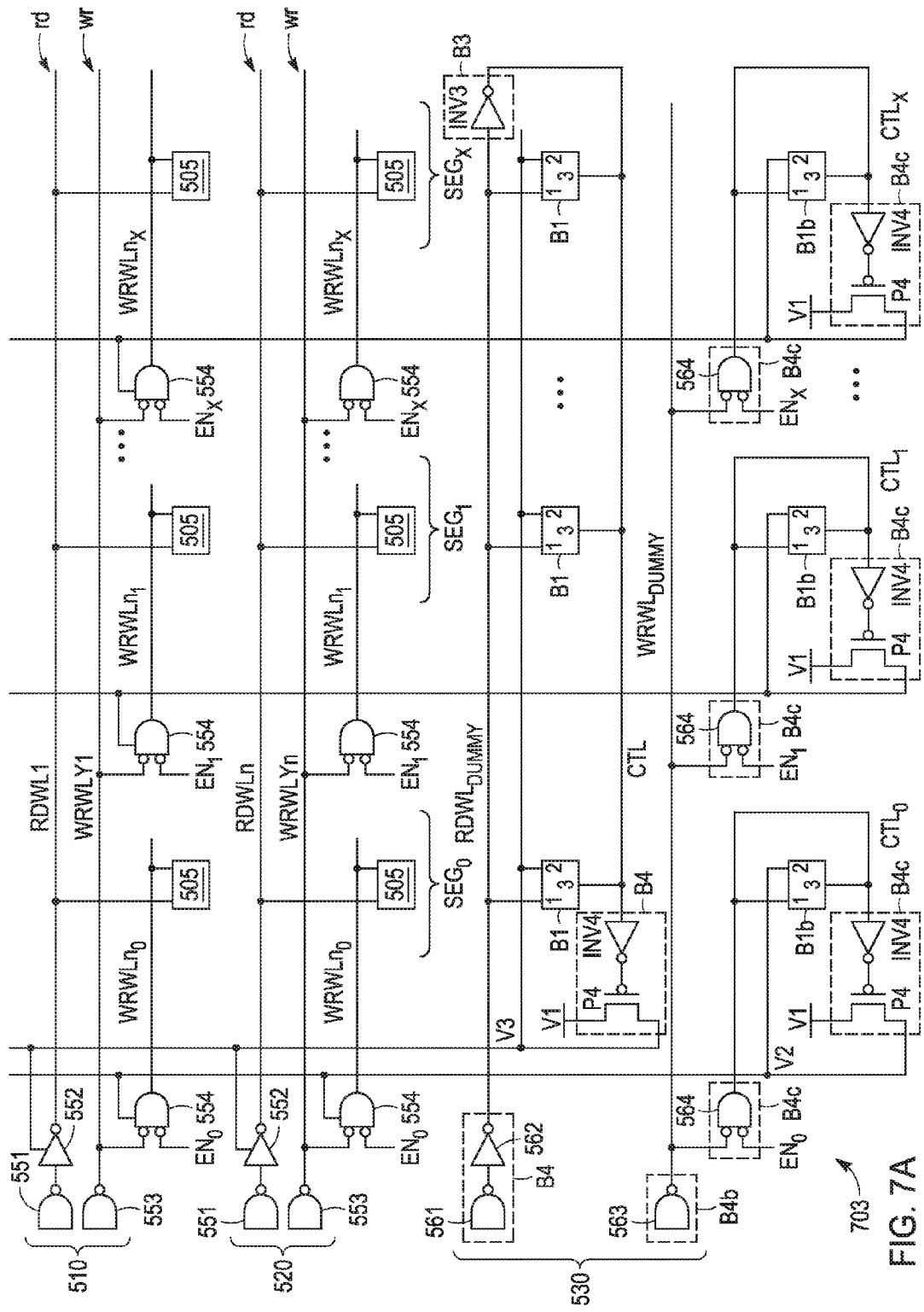
FIG. 7A shows a schematic diagram of a part of a register file with bit-write (e.g., special case of segmented write with 1 bit per segment), according to some embodiments described herein.

FIG. 7A shows a schematic diagram of a part of register file 703 including segments $SEG_0$, $SEG_1$, and $SEG_X$ having one memory cell in each segment, according to some embodiments described herein. Some of the components of register file 703 can be the same as register file 503. For simplicity, descriptions for the same components in register files 503 and 703 are not repeated. Differences between register files 503 and 703 include the number of memory cells 505 in each segment ($SEG_0$, $SEG_1$, and $SEG_X$ of any entry (e.g., each of portions 510 and 520). Read and write operations of register file 703 can be similar to or the same as register file 503. In FIG. 7A, each entry (e.g., portion 510 or 520) can include only one memory cell 505 (e.g., to store a bit of information) that can be written to (called bit-write) at a time, and all memory cells (e.g., all bits) of that entry can be read at the same time.

In FIG. 7A, circuit block B1 can include the same components as circuit block B1 of FIG. 5A. Circuit block B1b in FIG. 7A can also include the same components as circuit block B1 (FIG. 5) but with the addition of inverter INV3. A schematic diagram of circuit block B1b is shown in FIG. 7B.

Register file 703 includes improvements similar to those described above with reference to FIG. 2 through FIG. 6.

Figure 8:
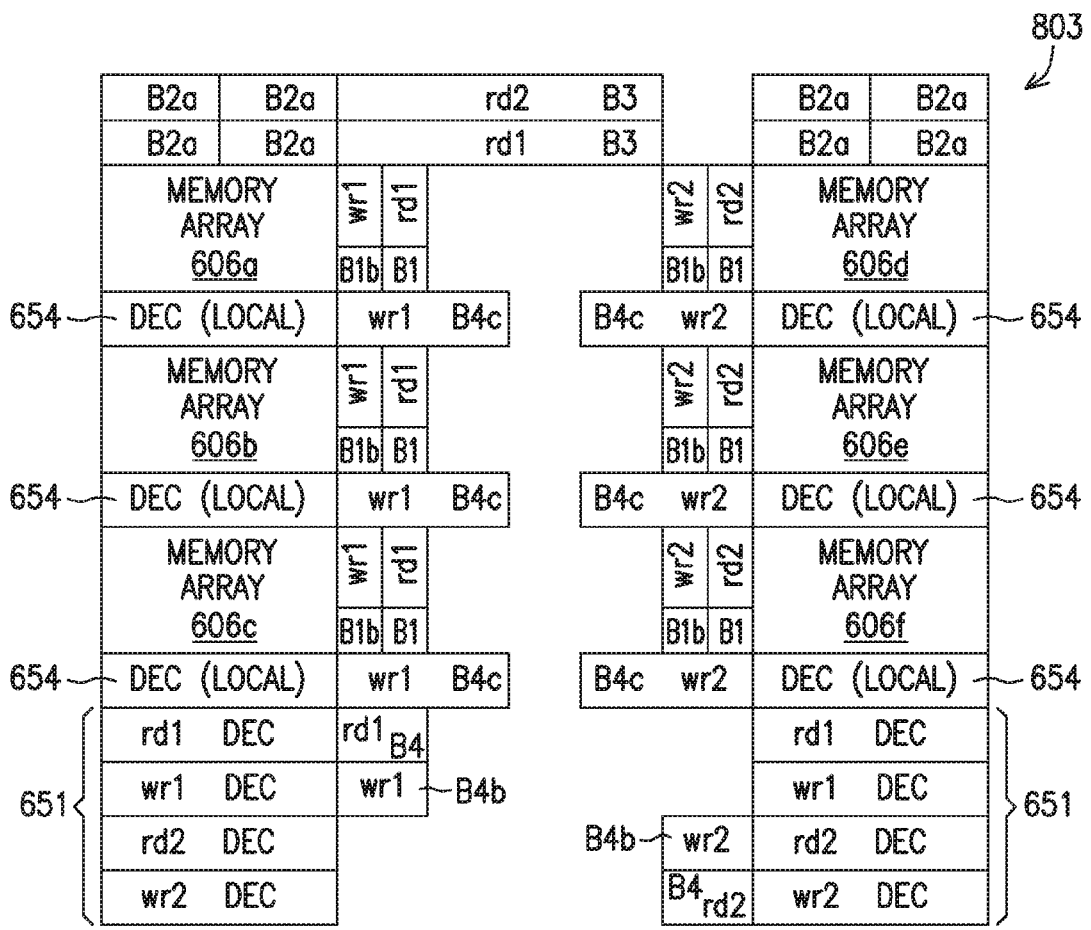
FIG. 8 shows a top view of an IC die including a register file having multiple read ports and multiple write ports with reduced circuit blocks, according to some embodiments described herein.

FIG. 8 shows a top view of an IC die 801 including a register file 803 having multiple read ports and multiple write ports with reduced circuit blocks, according to some embodiments described herein. The top view of IC die 801 can correspond to a layout of IC die 801. Register file 803 is similar to register file 603 of FIG. 6. Some of the components of register file 803 are the same as register 603. Thus, for simplicity, descriptions for the same components in register files 603 and 803 are not repeated.

In FIG. 8, unlike register file 603 of FIG. 6, register file 803 may not include blocks B2b and B3 for the write port. This saves die area. Circuit blocks B1 of FIG. 8 can include circuit blocks B1 of FIG. 7A. Circuit blocks B1b can include circuit blocks B1b of FIG. 7A and FIG. 7B. Each of circuit blocks B2a in FIG. 8 can include circuit blocks B2 of FIG. 2 (which can be similar to blocks B2a of FIG. 4). Circuit blocks B3, B4b, and B4c can include circuit blocks B3, B4b, and B4c, respectively, of FIG. 7A.

One skilled in the art would recognize that a register file such as register file 803 includes many additional components (e.g., bit lines and other components), several of which are not shown in FIG. 8 so as not to obscure the embodiments described herein.

The arrangement of register file 803 (e.g., the arrangement of circuit blocks B1, B1b, B2a, B4a, and B4b) may provide improvements, such as those described above with reference to FIG. 2 through FIG. 7B.

FIG. 9 shows an apparatus in the form of a system (e.g., electronic system) 900, according to some embodiments described herein. System 900 can include or be included in a computer (e.g., desktop or notebook computer), a tablet, a cellular telephone, and other electronic devices or systems. As shown in FIG. 9, system 900 can include a processor 910, a memory device 920, a memory controller 930, a graphics controller 940, an I/O controller 950, a display 952, a keyboard 954, a pointing device 956, at least one antenna 958, and a bus 960.

Processor 910 may be a general-purpose processor or an ASIC. Processor 910 can correspond to processor 100 (FIG. 1). Processor 910 can include a control unit 902, a register file 903, and an ALU 904. Control unit 902 can include control unit 102 (FIG. 1). Register file 903 can include a register file (e.g., register file 103, 203, 403, 503, 603, 703, or 803) and can perform its associated operations described above with reference to FIG. 1 through FIG. 8.

Memory device 920 may be a dynamic random access memory (DRAM) device, a static random access memory (SRAM) device, a flash memory device, or a combination of these memory devices. I/O controller 950 can include a communication module for wired or wireless communication (e.g., communication through one or more antennas 958). Display 952 can include a liquid crystal display (LCD), a touchscreen (e.g., capacitive or resistive touchscreen), or another type of display. Pointing device 956 can include a mouse, a stylus, or another type of pointing device.

As shown in FIG. 9, processor 910 can be located on (e.g., formed on or formed in) an IC die 901. Thus, control unit 902, register file 903, and ALU 904 of processor 910 can be located on the same IC die (e.g., IC die 901).

FIG. 9 shows the components of system 900 arranged separated from each other as an example. In some arrangements, two or more components of system 900 can be located on the same IC die (e.g., same IC chip) that forms a system-on-chip (SoC).

The illustrations of the apparatuses (e.g., processor 100, IC die 301, 401, 601, and 801, register files 103, 203, 403, 503, 603, 703, and 803, and system 900) described above are intended to provide a general understanding of the structure of different embodiments and are not intended to provide a complete description of all the elements and features of an apparatus that might make use of the structures described herein.

The apparatuses described above can include or be included in high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

Additional Notes and Examples

Example 1 includes subject matter (such as a device, an electronic apparatus (e.g., circuit, electronic system, or both), or a machine) including a first node to receive a supply voltage, a second node, a switching circuit to couple the first node to the second node and to decouple the first node from the second node, circuit blocks coupled to the second node and the switching circuit, each of the circuit blocks including a capacitor having a plate coupled to the second node, and drivers coupled to the second node, each of the drivers associated with a conductive line, the conductive line associated with memory cells.

In Example 2, the subject matter of Example 1 may optionally include, an additional conductive line coupled to the circuit blocks, the additional conductive line to conduct a signal to control a switching of the switching circuit.

In Example 3, the subject matter of Example 2 may optionally include, wherein the number of the circuit blocks is equal to the number of memory cells associated with the conductive line.

In Example 4, the subject matter of Example 2 may optionally include, wherein each of the circuit blocks includes an additional capacitor coupled to the additional conductive line.

In Example 5, the subject matter of any of Examples 1-4 may optionally include, wherein the switching circuit, the circuit blocks, and the drivers are included in a register file, and at least one of the drivers is part of a read port of the register file.

In Example 6, the subject matter of any of Examples 1-4 may optionally include, wherein the switching circuit, the circuit blocks, and the drivers are included in a register file, and at least one of the drivers is part of a write port of the register file.

In Example 7, the subject matter of any of Examples 1-4 may optionally include, wherein the conductive line includes a word line.

In Example 8, the subject matter of any of Examples 1-4 may optionally include, wherein each of the circuit blocks further includes an inverter coupled to the capacitor and the switching circuit.

In Example 9, the subject matter of any of Examples 1-4 may optionally include, wherein the switching circuit and the capacitor are part of circuitry to perform an operation to cause the value of the second node to be greater than a value of the supply voltage.

Example 10 includes subject matter (such as a device, an electronic apparatus (e.g., circuit, electronic system, or both), or a machine) including a first memory array included in a die, a second memory array included in the die, the die including a first area between a first edge of the first memory array and an edge of the second array, and a second area adjacent a second edge of the first memory array, and an additional area adjacent an additional edge of the first memory array, drivers located in the additional area and coupled to memory cells in the first memory array, and circuit blocks including capacitors located in the first and second areas and coupled to the drivers.

In Example 11, the subject matter of Example 7 may optionally include, wherein the circuit blocks further include inverters coupled to the capacitors.

In Example 12, the subject matter of Example 10 or 11 may optionally include, at least one inverter in a third area of the die, wherein the third area is adjacent the first and second areas.

In Example 13, the subject matter of Example 12 may optionally include, a fourth area adjacent the first area and the additional area, and a transistor located in the fourth area and coupled to the drivers.

In Example 14, the subject matter of Example 13 may optionally include, a driver in the fourth area.

In Example 15, the subject matter of Example 14 may optionally include, an inverter in the fourth area.

In Example 16, the subject matter of Example 10 or 11 may optionally include, conductive lines coupled to the drivers and extending in a direction parallel to the first edge of the first memory array.

In Example 17, the subject matter of Example 10 or 11 may optionally include, wherein the circuit blocks are included in a register file, the circuit blocks including first circuit blocks in the first area and second circuit blocks in the second area, and at least part of the first circuit blocks are associated with a read port of the register file.

In Example 18, the subject matter of Example 10 or 11 may optionally include, wherein the circuit blocks are included in a register file, the circuit blocks including first circuit blocks in the first area and second circuit blocks in the second area, and at least part of the first circuit blocks are associated with a write port of the register file.

In Example 19, the subject matter of Example 10 or 11 may optionally include, wherein the circuit blocks are included in a register file, the circuit blocks including first circuit blocks in the first area and second circuit blocks in the second area, and the first circuit blocks are associated with at least one read portion and at least one write port of the register file.

In Example 20, the subject matter of Example 10 or 11 may optionally include, additional circuit blocks in a third area of the die, wherein the third area is adjacent the first and second areas, and the additional circuit blocks are associated with at least one of a read port and write port of the register file.

In Example 21, the subject matter of Example 10 or 11 may optionally include, wherein each of the capacitors has a capacitance corresponding to a capacitance of each of the memory cells.

Example 22 includes subject matter (such as a device, an electronic apparatus (e.g., circuit, electronic system, or both), or a machine) including a control unit included in a processor, the control unit included in a die, a register file included in the processor, the register file included in the die, the register file including a first node to receive a supply voltage, a second node, a switching circuit to couple the first node to the second node and to decouple the first node from the second node, circuit blocks coupled to the second node and the switching circuit, each of the circuit blocks including a capacitor having a plate coupled to the second node, and drivers coupled to the second node, each of the drivers associated with a word line, the word line associated with memory cells.

In Example 23, the subject matter of Example 22 may optionally include, wherein the register file includes a conductive line coupled to the circuit blocks, the conductive line to conduct a signal to control a switching of the switching circuit.

In Example 24, the subject matter of Example 23 may optionally include, wherein each of the circuit blocks includes a number of loads coupled to the conductive line, and the number of the loads is equal to the number of memory cells associated with a word line, the word line associated with one of the drivers.

In Example 25, the subject matter of Example 24 may optionally include, wherein each of the loads is a model of one of the memory cells.

The subject matter of Example 1 through Example 25 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a first memory array included in a die;
   a second memory array included in the die, the die including a first area between a first edge of the first memory array and an edge of the second array, and a second area adjacent a second edge of the first memory array, and an additional area adjacent an additional edge of the first memory array;
   drivers located in the additional area and coupled to memory cells in the first memory array; and
   circuit blocks including at least one load group and at least one capacitive unit, the at least one load group and the at least one capacitive unit including capacitors located in the first and second areas and coupled to the drivers.

2. The apparatus of claim 1, wherein the circuit blocks further include inverters coupled to the capacitors.

3. The apparatus of claim 1, further comprising at least one inverter in a third area of the die, wherein the third area is adjacent the first and second areas.

4. The apparatus of claim 3, further comprising a fourth area adjacent the first area and the additional area, and a transistor located in the fourth area and coupled to the drivers.

5. The apparatus of claim 4, further comprising a driver in the fourth area.

6. The apparatus of claim 5, further comprising an inverter in the fourth area.

7. The apparatus of claim 1, further comprising conductive lines coupled to the drivers and extending in a direction parallel to the first edge of the first memory array.

8. The apparatus of claim 1, wherein the circuit blocks are included in a register file, the circuit blocks including first circuit blocks in the first area and second circuit blocks in the second area, and at least part of the first circuit blocks are associated with a read port of the register file.

9. The apparatus of claim 1, wherein the circuit blocks are included in a register file, the circuit blocks including first circuit blocks in the first area and second circuit blocks in the second area, and at least part of the first circuit blocks are associated with a write port of the register file.

10. The apparatus of claim 1, wherein the circuit blocks are included in a register file, the circuit blocks including first circuit blocks in the first area and second circuit blocks in the second area, and the first circuit blocks are associated with at least one read portion and at least one write port of the register file.

11. The apparatus of claim 1, further comprising additional circuit blocks in a third area of the die, wherein the third area is adjacent the first and second areas, and the additional circuit blocks are associated with at least one of a read port and write port of the register file.

12. The apparatus of claim 1, wherein each of the capacitors has a capacitance corresponding to a capacitance of each of the memory cells.

13. An apparatus comprising:
    a control unit included in a processor, the control unit included in a die;
    a register file included in the processor, the register file included in the die, the register file including:
    a first memory array included in a die;
    a second memory array included in the die, the die including a first area between a first edge of the first memory array and an edge of the second array, and a second area adjacent a second edge of the first memory array, and an additional area adjacent an additional edge of the first memory array;
    drivers located in the additional area and coupled to memory cells in the first memory array; and
    circuit blocks including at least one load group and at least one capacitive unit, the at least one load group and the at least one capacitive unit including capacitors located in the first and second areas and coupled to the drivers.

14. The apparatus of claim 13, wherein the register file includes a conductive line coupled to the circuit blocks, the conductive line to conduct a signal to control a switching of the switching circuit.

15. The apparatus of claim 14, wherein the at least one load group includes a number of loads coupled to the conductive line, and the number of the loads is equal to a number of the memory cells associated with a word line, the word line associated with one of the drivers.

16. The apparatus of claim 15, wherein each of the loads is a model of one of the memory cells.

17. The apparatus of claim 13, wherein the circuit blocks include first circuit blocks in the first area and second circuit blocks in the second area, and at least part of the first circuit blocks are associated with a read port of the register file.

18. The apparatus of claim 13, wherein the circuit blocks include first circuit blocks in the first area and second circuit blocks in the second area, and at least part of the first circuit blocks are associated with a write port of the register file.

19. The apparatus of claim 13, wherein the circuit blocks include first circuit blocks in the first area and second circuit blocks in the second area, and the first circuit blocks are associated with at least one read portion and at least one write port of the register file.

20. The apparatus of claim 13, further comprising additional circuit blocks in a third area of the die, wherein the third area is adjacent the first and second areas, and the additional circuit blocks are associated with at least one of a read port and write port of the register file.

* * * * *